United States Patent
Bergstedt et al.

(10) Patent No.: US 6,690,583 B1
(45) Date of Patent: Feb. 10, 2004

(54) CARRIER FOR ELECTRONIC COMPONENTS

(75) Inventors: Leif Bergstedt, Sjömarken (SE); Per Ligander, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/574,243

(22) Filed: May 19, 2000

(30) Foreign Application Priority Data

May 19, 1999 (SE) .............................. 9901831

(51) Int. Cl.[7] .................. H05K 7/02; H05K 7/06; H05K 7/08; H05K 7/10
(52) U.S. Cl. ............. 361/763; 361/764; 361/767; 361/773
(58) Field of Search .................. 361/760–761, 361/749, 748, 704, 712, 713, 762–765, 767, 777, 807

(56) References Cited

U.S. PATENT DOCUMENTS

| | | | |
|---|---|---|---|
| 4,899,118 A | | 2/1990 | Polinski, Sr. |
| 5,164,246 A | | 11/1992 | Tanaka et al. |
| 5,343,363 A | * | 8/1994 | Greeson et al. .............. 361/749 |
| 5,386,339 A | | 1/1995 | Polinski, Sr. |
| 5,452,182 A | * | 9/1995 | Eichelberger et al. ....... 361/749 |
| 5,532,513 A | | 7/1996 | Smith et al. |
| 5,599,747 A | * | 2/1997 | Bhatt et al. .................. 437/209 |
| 5,661,647 A | * | 8/1997 | Washburn et al. ........... 363/147 |
| 5,708,570 A | | 1/1998 | Polinski, Sr. |
| 5,831,828 A | * | 11/1998 | Cutting et al. ............... 361/704 |
| 5,855,803 A | | 1/1999 | Bailey et al. |
| 5,959,297 A | * | 9/1999 | Weinberg et al. ............ 250/288 |
| 6,288,905 B1 | * | 9/2001 | Chung ......................... 361/771 |
| 6,344,290 B1 | * | 2/2002 | Bossel .......................... 429/38 |

FOREIGN PATENT DOCUMENTS

WO 00/17924 3/2000

* cited by examiner

*Primary Examiner*—David Martin
*Assistant Examiner*—Thanh Y. Tran

(57) ABSTRACT

A carrier intended for one or several electronic components and having spaces provided for the components on at least one surface is provided. The carrier has an at least partly conductive Low Temperature Cofire Ceramic (LTCC) material with good thermal conduction capacity, so that the carrier provides mechanical support for the components and conducts heat generated by the components.

10 Claims, 2 Drawing Sheets

CARRIER FOR ELECTRONIC COMPONENTS

This application claims priority under 35 U.S.C. §119 and/or 365 to 9901831-9 filed in Sweden on May 19, 1999; the entire content of which is hereby incorporated by reference.

BACKGROUND

The present invention relates to a carrier intended for one or several electronic components, which comprises spaces provided for said components. The invention also relates to a method for manufacturing the carrier.

LTCC (Low Temperature Co-fired Ceramic) tape, e.g Green Tape® from DuPont, is known to be a very good medium when producing carriers for electronic components. The aim of a carrier is mainly to provide mechanical support for the components mounted on it and to allow arrangement of conductor paths.

The increasingly reduced size of components has enabled mounting of components inside the carrier or in cavities provided for receiving the components. A major problem within the electronics is the transferring heat generated by the components. Usually, the components are provided with cooling flanges or the like, which result in an additional manufacturing step and require more space. Specially when using MCM (Micro Circuit Material) components, cooling is difficult to accomplish because of the size of the components.

The Swedish Patent Application No. 9803204-8 discloses a new method and device for buried components, which eliminates a time consuming and complicated hole making between an upper surface layer of a carrier and the contact points of a component The carrier is made of, e.g glass epoxy material or ceramic materials. According to the application, vias are used for cooling of components.

On the market there are also so called "chip bays", which consist of bays etched in silicon plates. These bays can also be moulded in plastics. However, they have the common disadvantage of conducting heat poorly. Chip bays can also be made of recesses in metal.

SUMMARY

An object of the invention is to provide a carrier, preferably made of LTCC material, which in a very simple way permit mounting and cooling of electric component arranged inside or outside the carrier. The important advantage of the invention is that it allows a carrier and a cooling element in the same unit.

A second object of the invention is to provide a good ground plate essentially built in the carrier itself.

These objects have been achieved through the carrier consisting of at least partly conductive LTCC (Low Temperature Co-fired Ceramic) material with good thermal conduction capacity, so that the carrier besides providing mechanical support for the components also removes heat generated by the components.

Preferably, the carrier consists of a material comprising glass mixed with metallic particles, permitting refire of the material. Advantageously, said spaces comprise cavities or recesses which surround the components for better thermal conduction. Said components may comprise circuits according to the industrial standard "flip chip", which comprise a first surface and a second surface, which first surface is arranged with one or several contact points for connection to contacting members, which extend out of said space. The second surface is brought into the space and is fastened by means of an adhesive.

To provide a carrier with conductor paths, the surface of the carrier which carries the component and a portion of the component may be provided with a dielectric layer, afterwards the dielectric layer is provided with one or several conductor paths, which are connected to said contacting member.

In a preferred embodiment, said spaces are made through pressing or stamping.

The method according to the invention for manufacturing of a substantially heat conducting electronic component carrier, which consists of a LTCC material and is provided with spaces for receiving one or several electronic components, comprises the steps: producing a suitable piece of LTCC material, producing, at least on a main surface of the piece, at least one space provided for said components, bringing the piece into a substantially solid form, adding adhesive for attaching components, bringing said components into said spaces and fixing them by means of the adhesive, providing said main surface and components with a dielectric layer, producing conductors on said dielectric layer and to connect the conductors to a contacting member connected to said component.

BRIEF DESCRIPTION OF THE DRAWING

In the following, the invention will be described with reference to embodiments shown in the attached drawings, in which.

DETAILED DESCRIPTION

Figure 1:
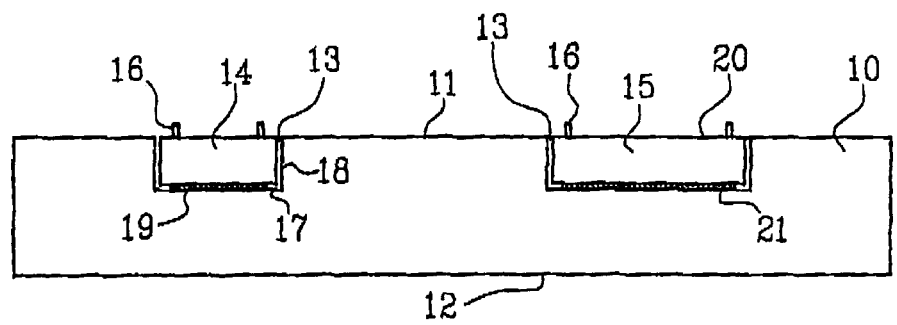
FIG. 1 is a schematic cross sectional view through a carrier according to the invention, and FIGS. 2–5 schematically show different steps of manufacturing of carrier and the mounting of the components.
Figure 2:
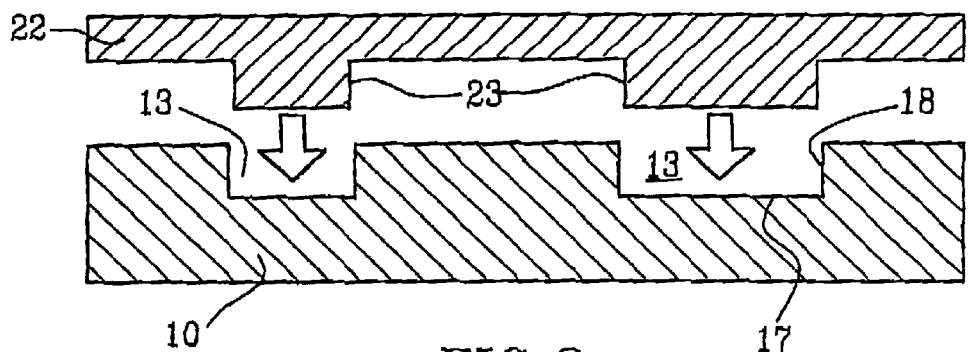

The carrier 10 as is shown in FIG. 1 consists of an electric conductive material with very good thermal conduction capacity. Less consideration is taken to the dielectric characteristic of the material. Advantageously, such a material is a LTCC material, e.g in the form of a LTCC tape. To obtain these characteristics, the material is assumed to be made of e.g glass mixed with metallic particles, such as copper, aluminium or the like, where the glass essentially surrounds the metallic particles. This results in satisfactorily firing and refiring of a LTCC material.

The carrier 10 comprises a first and a second main surfaces 11 and 12, respectively. On at least one of the main surfaces, e.g. the first one 11, cavities or recesses 13 are arranged for receiving components 14 and 15. Each component 14 and 15 in turn present a first and a second main surface 20 and 21 respectively, where the first surface 20 is provided with contact points 16. The components can consist of IC circuits, micro MCM, resistor array or the like.

Each cavity 13 is designed so that its form substantially corresponds to the component it will receive. Each cavity comprises a bottom surface 17 and side surfaces 18. The dimension of the cavity is chosen that when it surrounds the component a very good contact between the surfaces of the cavities and the exterior of the component is obtained and an optimum heat conduction can be achieved. The contact between the surfaces can be amplified, e.g. by applying a heat conductive paste or the like of known type on the surfaces.

The component is affixed to the bottom surface 17 (or other suitable surface) of the cavity through its second surface 21 by means of e.g. an adhesive 19, such as glue, preferably with good thermal conduction capacity.

Furthermore, the depth of the cavity should correspond to the thickness of the component (plus the adhesive) so that plane surface between the first main surface 11 of the carrier and the first main surface 20 of the component is achieved. Normally, the depth of the cavity can vary between about 0.5–0.15 μm.

Afterwards, the contact points 16 can be provided with contacting member (not shown), which first end is connected to the contact point 16. The contacting member can comprise a "bump", which permits use of chips according to the industrial standard "flip chip".

The FIGS. 2–5 very schematically show the steps for manufacturing cavities in the carrier and mounting of the components.

The carrier 10, which preferably consists of LTCC tape with a suitable thickness, is cut in appropriate lengths. Then, the cavities 13 are pressed or stamped on at least one first main surface 11 of the carrier 10 by means of a tool 22. The tool 22 comprises a plate provided with elevations 23 (or other pattern) corresponding to the cavities 13 for receiving the components on one of the surface. Because of the characteristics of the LTCC material the material flows away during the pressing so that considerably flat surfaces are formed under the pressing tool. During the pressing, the carrier is exposed to heat. Other types of recessing may also be used.

To make the carrier keep its form, it is fired (in a conventional way in connection with the firing of the LTCC material). If the carrier comprises several laminates, these are attached together in this step.

Figure 3:
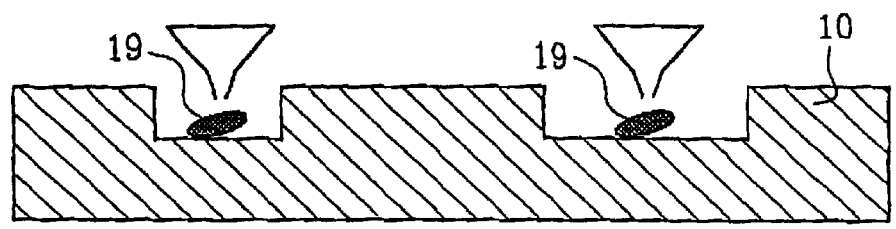

Afterwards, the adhesive 19 is applied in the cavities 13 where components should be received, as shown in FIG. 3. It is possible to apply other substances, such as paste for thermal conduction, in this step. The adhesive can also be applied on the components.

Figure 4:
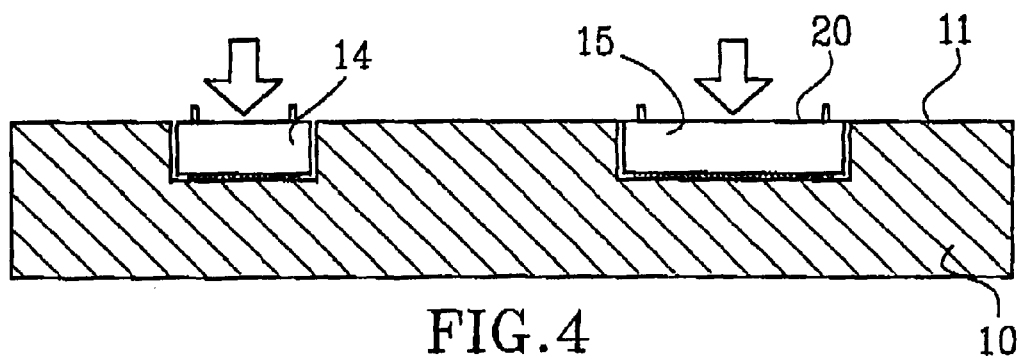
Figure 5:
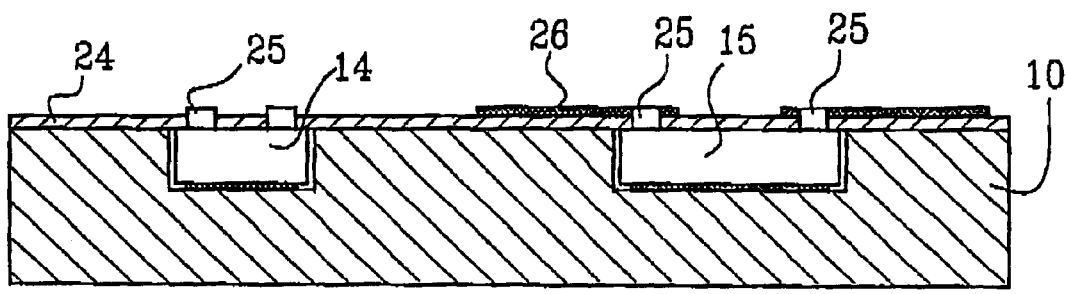

Afterwards, the components 14 and 15 are brought into the corresponding cavities and are pressed so that the surface 20 distanced from the cavity bottom surface, is essentially leveled with the first main surface 11 and constitute a flat surface, as shown in FIG. 4.

Then a dielectric layer 24 can be provided on said first main surface 11 of the carrier and over the components 14 and 15 after connecting suitable contacting members 25 to the contact points of the components. Conductor paths 26 can then be arranged in a suitable way on the dielectric layer 24, e.g. through sputtering, planting, bonding or the like.

The dielectric layer 24 can be applied in liquid form or as a flexible laminate. The contacting member 25 should have such a length that it exceeds the thickness of the dielectric layer so that contact between the contacting members and conductor paths can be obtained.

While we have only illustrated and described a preferred embodiment of the invention, it should be realized that several variations and modifications within the scope of the appended claims can occur.

What is claimed is:

1. A carrier for mounting at least one electronic component, said component having a top surface, a bottom surface, and a plurality of lateral sides, said carrier comprising:
   a main body having a substantially planar top surface, said body being constructed, to a depth at least as great as the height of the component, of a single layer of Low Temperature Co-fired Ceramic (LTCC) material having good thermal conduction capacity, said top surface having at least one recess formed therein for providing mechanical support for the at least one component and conducting away heat generated by the component, said recess having sides of substantially the same dimension and form as the lateral sides of the component, and having a depth substantially equal to the height of the component;
   an adhesive applied to a bottom surface of the recess for mounting the component in the recess;
   at least one electrical contact member mounted on the top surface of the component and extending outward from the surface a predetermined height;
   a dielectric layer covering the top surface of the main body and the top surface of the component mounted in the recess, said dielectric layer having a thickness that is less than the predetermined height of the electrical contact member; and
   at least one conductive path formed on the dielectric layer.

2. The carrier of claim 1, wherein the LTCC material comprises glass mixed with metallic particles.

3. The carrier of claim 1, wherein the recess is sized to accept an industrial standard "flip chip".

4. The carrier of claim 1, wherein the at least one conductive path on the dielectric layer is connected to the at least one electrical contact member.

5. A method of manufacturing a heat conducting carrier for at least one electronic component, the method comprising the steps of:
   manufacturing a piece of Low Temperature Co-fired Ceramic (LTCC) material;
   forming on a surface of the piece, at least one recess for mounting the component, said recess having sides of substantially the same dimension and form as the component, and having a depth substantially equal to a height of the component, said forming step comprising:
      heating the material; and
      pressing the recess into the surface with a forming plate having extensions thereon of the desired dimension and form for the recess;
   cooling the piece into a substantially solid form;
   adding adhesive to a bottom surface of the recess;
   adhering the mounted component to the bottom surface of the recess by means of the adhesive;
   placing a dielectric layer over the at least one surface of the piece and the mounted component;
   arranging conductive paths on the dielectric layer; and
   connecting the conductive paths to electrical contact members connected to the component.

6. The method of claim 5, wherein the step of manufacturing a piece of LTCC material includes mixing glass with metallic particles.

7. The method of claim 6, wherein the step of mixing glass with metallic particles includes mixing glass with metallic particles selected from the group consisting of aluminum and copper.

8. The method of claim 5, where the step of placing a dielectric layer over the surface of the piece and the mounted component includes placing a dielectric layer with a thickness that is less than the height of the electrical contact members.

9. The method of claim 5, wherein a plurality of components are mounted in a plurality of recesses, and the steps of arranging conductive paths on the dielectric layer and connecting the conductive paths to the electrical contact members include arranging the conductive paths to link the plurality of components, and connecting the conductive paths to the electrical contact members of the plurality of components.

10. The method of claim 5, further comprising applying thermal conductive paste to the sides of the recess prior to adhering the mounted component to the bottom surface of the recess.

* * * * *